United States Patent
Klein et al.

(10) Patent No.: US 8,314,418 B2
(45) Date of Patent: Nov. 20, 2012

(54) ELECTROLUMINESCENT ORGANIC SEMICONDUCTOR ELEMENT AND A METHOD FOR REPAIR OF AN ELECTROLUMINESCENT ORGANIC SEMICONDUCTOR ELEMENT

(75) Inventors: Markus Klein, Tegernheim (DE); Tilman Schlenker, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 429 days.

(21) Appl. No.: 12/527,133

(22) PCT Filed: Feb. 1, 2008

(86) PCT No.: PCT/DE2008/000197
§ 371 (c)(1),
(2), (4) Date: Sep. 28, 2009

(87) PCT Pub. No.: WO2008/098551
PCT Pub. Date: Aug. 21, 2008

(65) Prior Publication Data
US 2010/0090207 A1      Apr. 15, 2010

(30) Foreign Application Priority Data
Feb. 16, 2007   (DE) .......................... 10 2007 007 853

(51) Int. Cl.
*H01L 29/08* (2006.01)
(52) U.S. Cl. ..................... 257/40; 257/79; 257/E51.022
(58) Field of Classification Search .................... 257/40, 257/E51.022, 79, 80, 88, 103
See application file for complete search history.

(56) References Cited

U.S. PATENT DOCUMENTS

| | | |
|---|---|---|
| 5,719,467 A | 2/1998 | Antoniadis et al. |
| 5,723,873 A | 3/1998 | Yang |
| 6,235,414 B1 * | 5/2001 | Epstein et al. ................ 428/690 |
| 6,366,017 B1 | 4/2002 | Antoniadis et al. |
| 6,420,031 B1 | 7/2002 | Parthasarathy et al. |
| 2003/0219923 A1 | 11/2003 | Nathan et al. |
| 2006/0290277 A1 | 12/2006 | Takahashi et al. |
| 2007/0096112 A1 * | 5/2007 | Hoshi ............................. 257/79 |
| 2007/0273276 A1 * | 11/2007 | Ottermann et al. ........... 313/505 |

FOREIGN PATENT DOCUMENTS

| | | |
|---|---|---|
| DE | 197 57 874 A1 | 12/1998 |
| DE | 10 2005 027 961 A1 | 1/2007 |
| EP | 1 076 368 A2 | 2/2001 |
| EP | 1 505 664 A2 | 2/2005 |
| JP | 09-162440 | 6/1997 |

(Continued)

OTHER PUBLICATIONS

Gustafsson G., et al., "Flexible Light-Emitting Diodes Made from Soluble Conducting Polymers", Nature, 1992, pp. 477-479, vol. 357, Nature Publishing Group, London.

(Continued)

*Primary Examiner* — Tucker Wright
(74) *Attorney, Agent, or Firm* — Slater & Matsil, L.L.P.

(57) ABSTRACT

An electroluminescent organic semiconductor element includes a substrate and a first electrode arranged on the substrate. The semiconductor element additionally contains a second electrode and at least one organic layer, which is arranged between the first electrode and the second electrode. The organic layer is a layer that generates light by recombination of charge carriers. At least one of the first and the second electrode contains a highly conductive organic sublayer.

20 Claims, 4 Drawing Sheets

FOREIGN PATENT DOCUMENTS

| | | |
|---|---|---|
| JP | 2003-178871 | 6/2003 |
| JP | 2005-114487 | 4/2005 |
| WO | WO 97/32452 | 9/1997 |
| WO | WO 98/06122 | 2/1998 |
| WO | WO 2007/004118 A2 | 1/2007 |
| WO | 10 2005 060 159 A1 | 6/2007 |
| WO | 10 2006 030 536 B3 | 2/2008 |

OTHER PUBLICATIONS

Kijima Y., et al., "A Blue Organic Light Emitting Diode, Japanese Journal of Applied Physics", 1999, pp. 5274-5277, vol. 38, Tokyo.

Becker H., et al., "Novel Triplet Host Materials: High Performance Made Easy", SID Digest, 2005, pp. 1062-1065, vol. 22.2, Frankfurt, Germany.

* cited by examiner

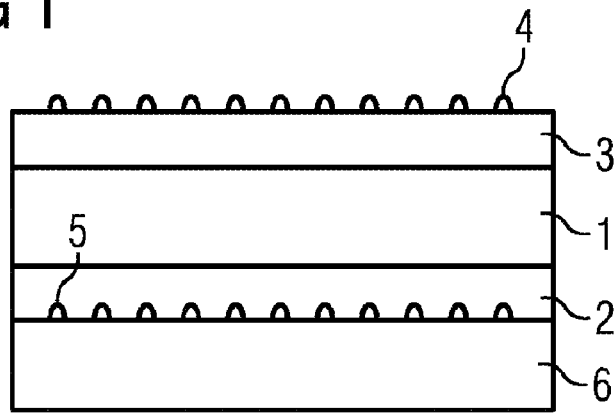
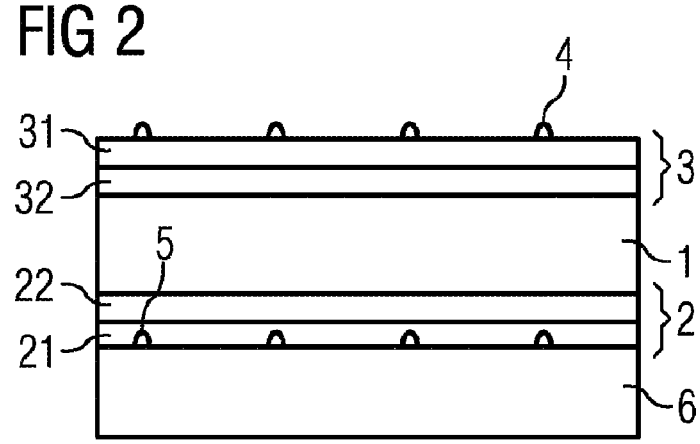
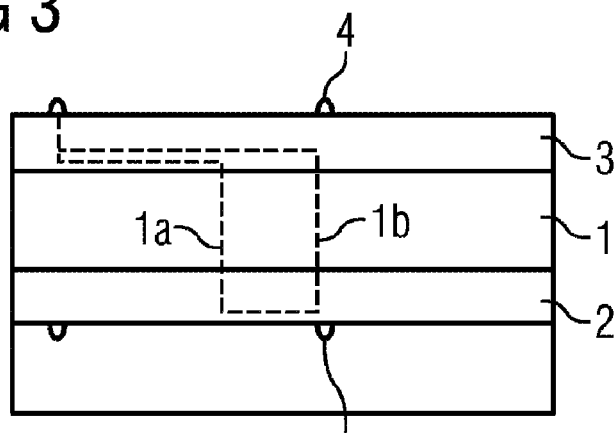

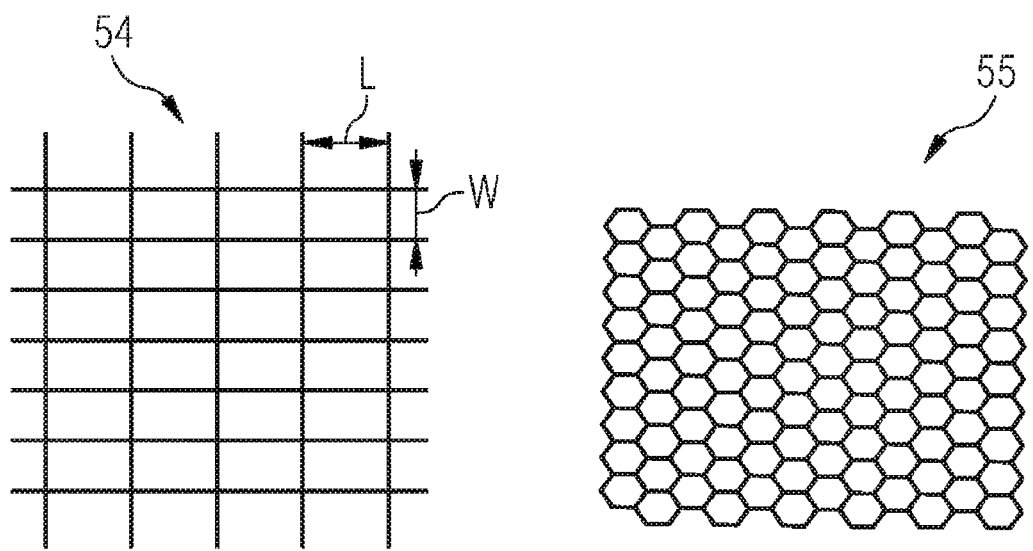
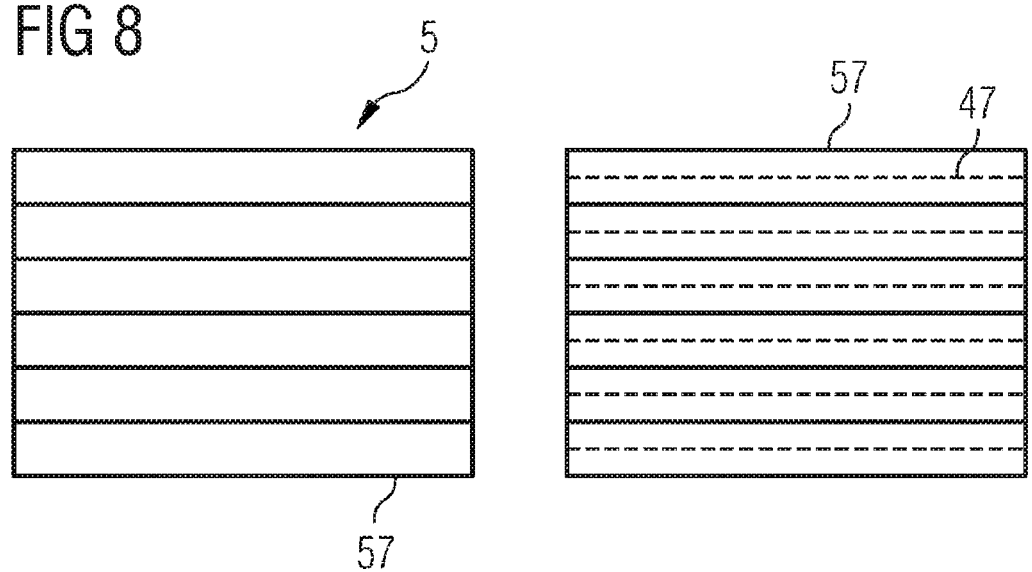

PRIOR ART

ELECTROLUMINESCENT ORGANIC SEMICONDUCTOR ELEMENT AND A METHOD FOR REPAIR OF AN ELECTROLUMINESCENT ORGANIC SEMICONDUCTOR ELEMENT

This patent application is a national phase filing under section 371 of PCT/DE2008/000197, filed Feb. 1, 2008, which claims the priority of German patent application 10 2007 007 853.8, filed Feb. 16, 2007, each of which is incorporated herein by reference in its entirety.

TECHNICAL FIELD

The invention concerns an electroluminescent organic semiconductor element and a method for repair thereof.

BACKGROUND

Electroluminescent organic semiconductors, also called OLEDs, are currently used mainly for flat-screen displays. However, they are becoming increasingly important in normal light applications, since they have high luminosity and low current consumption. In general, an electroluminescent organic semiconductor consists of a substrate on which a light-emitting organic material is arranged between two electrodes. The electrodes, very often made of a metal or a metal oxide such as indium-doped tin oxide (ITO) or indium-doped zinc oxide (IZO), serve to distribute the charge carriers, which generate light upon recombination, as uniformly as possible over the surface of the organic material. A better luminous efficacy is achieved through the large-area distribution. Thereby, electrons are initiated into the organic material by the cathode, while the anode provides the required positive charge carriers in the form of holes.

The organic material typically consists of several sequences of layers which have different tasks. FIG. 10 shows a typical structure of two electrodes, 200 and 300, and the "OLED stack" arranged between them, from H. Becker, et al., SID Digest (2005). The electrons or holes are transported to the layer intended for photon generation through the individual layer sequences, the thicknesses of which are given as examples in FIG. 10. In this case, these are the three uppermost layers of the stack, which comprises at least one organic layer 1. At the same time, the lower layer sequences serve to limit exciton diffusion or block undesired hole or electron transport. For example, layers S-TAD and 1-TNATA serve as hole transporters or electron blockers. Through this, holes or electrons are kept in the layer intended for recombination, so that the recombination efficiency and thus the luminous efficacy increase. Basically speaking, the light generated by the charge carrier recombination can be extracted through the cathode or the anode, or even through both.

SUMMARY

An important point in the use of organic light-emitting diodes as a light source lies in the required cost per unit area. Due to the currently used anodes of indium-doped tin oxide or indium-doped zinc oxide and the cathodes of a conductive layer, considerable costs result from the required lithographic processes. In particular, the production of large-area light sources thus would lead to increased expense. Moreover, there may be problems in realizing transparent electrodes, which are required, for example, for the so-called top emitters. Here, the uppermost layer is transparent to the light generated by the charge carrier recombination. Transparent conductive oxides such as antimony tin oxide or indium tin oxide and also thin metal electrodes are primarily used here. Depending on the cathode materials that are used, the process of producing an optical light diode also involves high costs in this case. In addition, the conductivity of the electrode is often problematic, due to which the luminous efficacy is reduced.

Accordingly, aspects of the present invention provide electroluminescent organic semiconductors with which, on the one hand, the luminous efficacy can be improved and, on the other hand, the production costs can be reduced. In other aspects, a method in which manufacturing tolerances or faulty locations in an organic light-emitting diode can be repaired without greater limitations regarding the luminous efficacy is provided.

The invention envisions that at least one of the two electrodes in an electroluminescent organic semiconductor element, between which the organic layer sequence is arranged, is replaced by a highly conductive organic layer. With this, many problems, in particular, in the manufacturing of the light diodes, can be avoided.

Correspondingly, an electroluminescent organic semiconductor element in accordance with the invention consists of a substrate, a first electrode arranged over the substrate, a second electrode, and an organic layer sequence that is arranged between the first and second electrodes and comprises a layer that generates light by charge carrier recombination. At least one of the first and second electrodes contains a highly conductive organic sublayer. The highly conductive organic sublayer in accordance with the invention takes on the two-dimensional lateral distribution of the delivered charge carriers and thus is an important component of the electrode.

The problems in production processes that result from the currently used conductive oxides or metal oxides can be reduced through the use of a highly conductive organic sublayer. Thus, the highly conductive organic sublayer can advantageously be at least partially transparent to the light generated by charge carrier recombination. This results in simple and cost-efficient production of organic light-emitting diodes with an at least partially transparent electrode. In addition, both electrodes can be implemented with highly conductive organic sublayers. This allows a development of an at least partially transparent component in an especially simple way.

In one embodiment of the invention the highly conductive organic sublayer can consist of a material from the classes of the so-called "small molecules," the polymers, or some other organic class. For example, it can be PEDOT:PSS (poly(3,4-ethylenedioxythiophene):poly(styrene sulfonate)) compounds. Doped polyaniline, polypyrrole, and polythiophene are especially suitable as the doped polymer. PANI:PSS materials or other substances from the class of the polystyrenes such as polystyrene sodium sulfonate are likewise possible. If the highly conductive organic sublayer consists of materials from the class of the "small molecules," these can be, amongst others, doped systems such as ZnPC (zinc phthalocyanine) with a benzene derivative that functions as an electron donor or acceptor (TCNQ). Other examples comprise a metal oxide with a charge transfer complex, for example, MeO-TPD/F4-TCNQ or BEDT-TTF (tetrathiavulvalene) materials, that is an organic superconductor.

It is likewise possible for the highly conductive organic sublayer to have a polymer doped with a metal, organic salt or purely inorganic salt. The conductivity and type of charge can be improved by the use of a metal doping. Specific n- or p-conduction can be realized in this way. In a further development of the invention, a metallization layer can be situated between the first electrode and the substrate or on the second electrode. This can lead to further improvement of the lateral conductivity of the electrodes and of the luminous efficacy.

According to another aspect of the invention, at least one first electrode comprises a second conductive sublayer which has different conductivity relative to the highly conductive organic sublayer. By means of additional conductive, preferably organic, sublayers, the highly conductive organic sublayer can be matched to the organic layer sequence in which charge carrier recombination takes place. For example, production processes can thus be combined. In another possible embodiment of the invention, the conductive sublayer consists of a doped organic material. It can be arranged between the highly conductive organic sublayer and the organic layer sequence. Moreover, it can be expedient if this second conductive sublayer has a different type of conduction than that of the highly conductive organic sublayer. For example, highly conductive organic sublayers can be used for electrodes and can be matched to the organic layer sequence. In the same way, it is possible for the second conductive sublayer to comprise an inorganic material, for example, a metal.

In another development of the invention, a metallic bus electrode is provided that is applied to the highly conductive organic sublayer, and with that, to the at least one electrode. The metallic bus electrode advantageously serves to reduce the surface resistance and thus to reduce the lateral voltage drop due to the resistance of the electrodes. The lateral current distribution is also improved.

In one embodiment of the invention, the second electrode can also comprise a highly conductive organic sublayer, on which is applied a metallic bus electrode, if required. The metallic bus electrodes can have a plurality of conducting segments that run essentially parallel to each other. If two electrodes, each with a highly conductive organic sublayer, are used, an alternating structure of the bus electrodes is particularly expedient. This allows the same path length to advantageously be achieved on different conductive paths through the organic light-emitting diode. A lateral voltage drop over a non-ideal conductive layer becomes partially compensated.

In another embodiment of the invention, the metallic bus electrode consists of a plurality of conducting segments that are electrically connected together into a honeycomb structure. Such a structure leads to improved lateral current distribution through the organic highly conductive electrode, and with that to a higher luminous efficacy at the same power consumption. In another embodiment of the invention, the first and the second electrodes have essentially the same sheet resistance.

The electroluminescent organic semiconductor element presented here, in which at least one electrode has a metallic bus electrode to improve lateral voltage drop, can be repaired very simply. In a method for repair of an electroluminescent organic semiconductor element in accordance with the invention, in a first step, the faulty location in an organic layer of the semiconductor element is identified. Among other ways, this can be done by visual inspection of the electroluminescent organic semiconductor element. If such a faulty location is found in an organic layer, conductive segments of the bus electrodes that lie in the region of the identified faulty location are identified. Then, these identified conductive segments are selectively destroyed in order to increase the voltage drop in the region of the faulty location in the organic layer.

In a light source that is not made perfectly, the faulty location can give rise to a local short circuit, which will lead to damage of the electroluminescent organic semiconductor element. By selectively destroying conducting segments of bus electrodes in the region of the identified faulty location, the voltage drop in the affected organic layer can be increased. This produces an additional resistance element, so that the local short circuit caused by the faulty location does not have any damaging effects on the organic semiconductor element. The method in accordance with the invention nevertheless will not have an effect on the overall performance of the light element, provided the ratio of active to excised area remains large enough.

In particular, a laser-beam-induced parting of the identified conducting segments of the bus electrodes is suitable for the selective destruction.

BRIEF DESCRIPTION OF THE DRAWINGS

Below, the invention will be explained in detail by means of a number of embodiment examples with the assistance of the drawings.

FIG. 1 shows a first embodiment example of the invention,

FIG. 2 shows a second embodiment example of the invention with several electrode sublayers, FIG. 3 shows an embodiment example of the invention for representation of equal path lengths in different conducting paths, FIG. 7 shows two embodiment examples for different bus electrode structures, FIG. 8 shows two additional embodiment examples for bus electrode structures.

DETAILED DESCRIPTION OF ILLUSTRATIVE EMBODIMENTS

Figure 4:
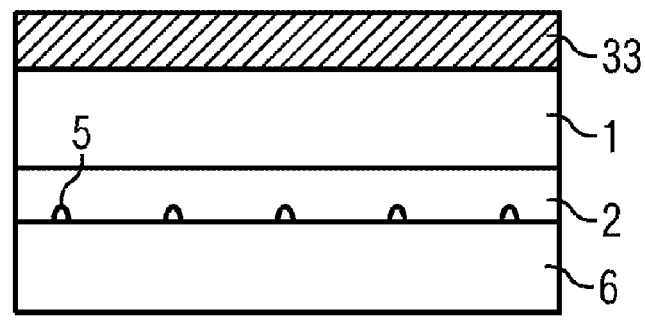
FIG. 4 shows a fourth embodiment example of the invention.

FIG. 1 shows an embodiment of an electroluminescent organic semiconductor element, also called an organic light-emitting diode, with an electrode structure that is composed of a highly conductive organic material.

The organic light-emitting diode here is applied to a substrate 6. This substrate 6 can, for example, comprise glass as a transparent material or also a transparent, nonconducting organic polymer. A first electrode 2, which comprises an organic highly conducting layer, is applied to the substrate 6. It serves for lateral distribution of the charge carriers for vertical injection into the overlying layer sequence. In addition, the first electrode 2 comprises bus electrodes 5 arranged in a structure that contains a plurality of parallel metallic conducting segments. Particularly in the case of large components, an improved lateral distribution of charge carriers, and thus current, is achieved through the additional conducting segments. The application of highly conductive metal materials is called shunting and can be done by ink jet printing, screen printing or shadow mask vapor deposition processes.

The actual OLED stack with the light-generating sublayer is applied to the first electrode 2 with the highly conductive organic layer. The individual OLED stack (OLED stands for organic light-emitting diode) can comprise a plurality of organic layers 1. It has different tasks, for example, injection of charge carriers, charge carrier transport, or blocking electrons or holes. In addition, the exciton diffusion should be reduced or limited by the several organic layers 1. The actual charge carrier recombination takes place within a narrowly limited region of the OLED stack. The electrons injected by the cathode recombine with the holes from the anode and lead to photon regeneration. It is also possible to make different-colored diodes by, for example, applying different layers in which charge carriers recombine.

Another highly conductive organic layer, which can be an anode, is deposited on the OLED stack as the second electrode 3. It can additionally contain other bus electrodes of a plurality of parallel conducting segments arranged in a structure. The electrodes can have different materials, which is of particular advantage since holes and electrons are injected and they behave differently. Thus, good hole or electron conductors are selected.

The bus electrodes 4, arranged in a structure on the upper side of the second electrode 3, can be applied simply by vapor deposition, by printing or similar means. The structure of the bus electrodes 5 of the first electrode 2 can be realized in the same way.

Additional organic and conductive sublayers can be provided within electrodes 2 and 3 to improve the matching of the layers to each other.

FIG. 2 shows an embodiment example of this kind Here, the first electrode 2 comprises a first highly conductive organic sublayer 21 and a second conductive sublayer 22. The first highly conductive organic sublayer 21 is electrically connected to the bus electrodes 5 of the first electrode 2. The second conductive sublayer 22, which can be organic or a metallization layer, serves to match the energy level or the process compatibility to the lower layers of the OLED stack or the at least one organic layer 1. Such a design is especially expedient when, for example, different processes and production methods are required for the production of the first layer of the OLED stack and the highly conductive organic sublayer 21. Also, the second conductive sublayer 22 can then be appropriate, if the organic highly conductive sublayer 21 and the organic layers 1 of the OLED stack chemically react with each other in an undesirable way. In this case, the additional second conductive sublayer 22 acts as insulation with respect to undesired chemical reactions.

In the same way, the second electrode 3 comprises the highly conductive organic sublayer 31 on the upper side and a second conductive sublayer 32, which is arranged between the highly conductive organic sublayer 31 and the at least one organic layer 1, for example, an OLED stack. The second conductive sublayer 32 here also serves to better match the highly conductive organic sublayer 31 to the OLED stack or the at least one organic layer 1. In this embodiment, the OLED stack comprises only one organic layer 1, in which photon generation takes place by charge carrier recombination. In order to guarantee the highest possible recombination efficiency and thus luminous efficacy, the electrodes 2 and 3 are applied with their highly conductive organic sublayers 21 and 31 over an area on the OLED stack. For further improvement of the lateral current distribution, the bus electrodes 4 and 5 are additionally provided on both sides of electrodes 2 and 3. The maximally permitted sheet resistance $R_{sqr}$ of the organic electrodes 2 and 3 can be estimated as a function of the geometric boundary conditions and the required current density j.

Figure 9:
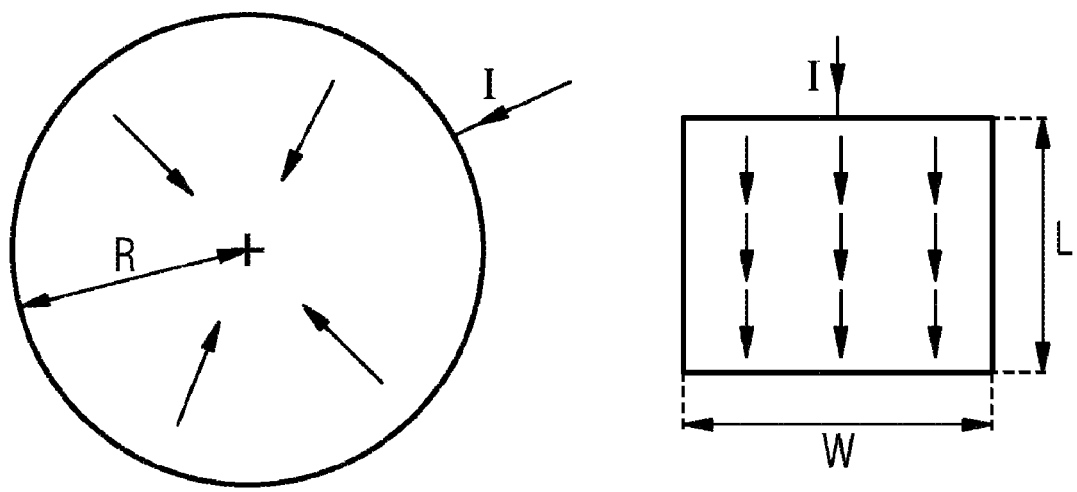
FIG. 9 shows a representation to illustrate the conducting path for estimating of lateral resistance.
Figure 10:
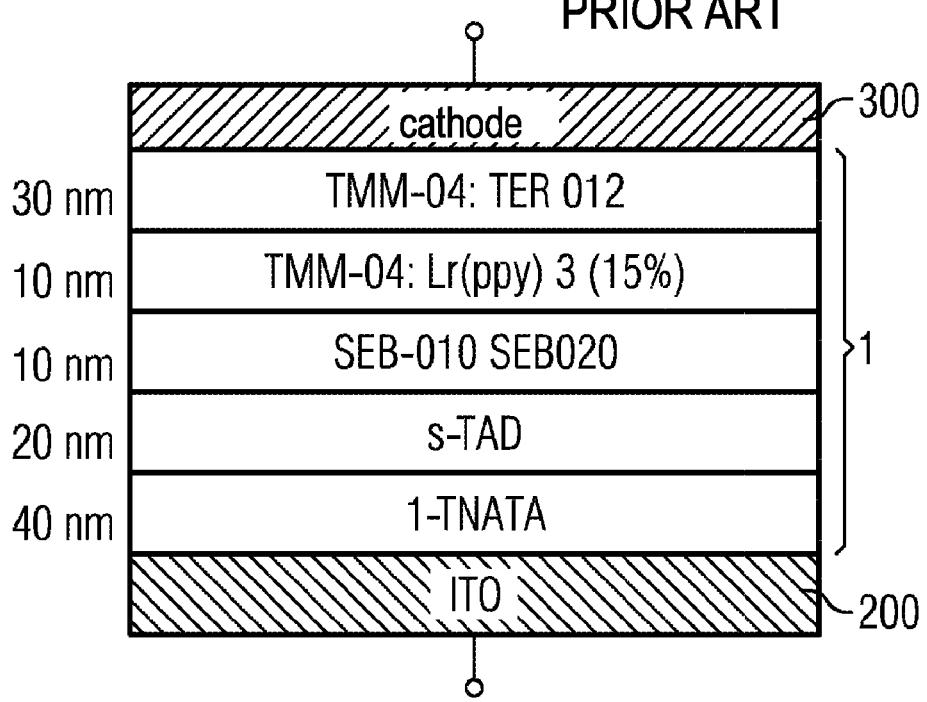
FIG. 10 shows a representation of a structure of a known organic semiconductor element.

In this regard, FIG. 9 shows two schematic representations, a round and a rectangular electroluminescent organic semiconductor element. The round semiconductor element has a radius R, while the rectangular element has a length L and a width W. The round semiconductor element is externally connected to a current source for supply of current I. Correspondingly, the rectangular semiconductor element is connected to a current source on one side. The feed to the current source in each case has infinite conductivity.

It should further be assumed that the actual current density j through the OLED stack and thus the organic layer sequence or the at least one organic layer 1 here is perpendicular to the surface and constant in area. The total current I flowing through the electroluminescent organic semiconductor element thus results from the current density j multiplied by the area of the structure. For the round electroluminescent organic semiconductor element with radius R, in a first approximation, the maximum lateral voltage drop $U_{max}$ over the electrode is:

$$U_{max} = \frac{1}{4\pi} R_{sqr} I = \frac{1}{4} R_{sqr} R^2 j$$

For the quadratic structure with width W and length L, the maximum lateral voltage drop $U_{max}$ is:

$$U_{max} = \frac{1}{2W} R_{sqr} I = \frac{1}{2} R_{sqr} L^2 j$$

The luminous efficacy is a major aspect for lighting applications. It typically can be 100 cd/m² up to 5000 cd/m². For a luminous efficacy of 1000 cd/m² and a desired efficiency of 50 cd/A, we have a current density j=20 A/m². The maximum lateral voltage drop for an operating voltage $U_B$ of about $U_B$=5 V should not exceed a value sf $U_{max}$=100 mV. Thus, in dependence on the radius R=1 mm, we have a sheet resistance $R_{sqr}$ of less than $$R_{sqr} = \frac{4 U_{max}}{R^2 j} = 80 \text{ k}\Omega$$

In the case of the quadratic semiconductor element with a bus electrode structure that runs parallel at spacings of L=0.5 mm, the resistance $R_{sqr}$ is:

$$R_{sqr} = \frac{2 U_{max}}{L^2 j} = 40 \text{ k}\Omega$$

For an assumed electrode layer thickness of 100 mm this means a minimum specific conductivity (in S) for the geometric boundary conditions shown above:

σ=1.25 S/cm for the round element, or
σ=2.5 S/cm for the rectangular semiconductor element.

The conductivity shown can easily be achieved with organic light-emitting diodes, for example, PEDOT, with values up to over σ=200 S/cm. In addition, to improve the conductivity, the organic sublayer can be doped with suitable materials. Also, the class of the "small molecules" can be used for this as the organic sublayer. The resulting conductivity of the organic sublayer rises to values that obviates an area-wise termination with a metal electrode and suitable bus electrodes under suitable geometric boundary conditions, where the doping within the organic sublayer produces ohmic contact with the material of the bus electrode itself Another aspect concerns the design of the bus electrodes within the electrodes 2 or 3.

FIG. 3 shows a pertinent embodiment example. In this arrangement, the bus electrodes 51 of the first electrode 2 are applied on electrode 2 and thus in substrate 6. This can be achieved, for example, by selectively applying conducting paths or conducting segments to the substrate 6, which can be a glass substrate. Then the first electrode 2 with the highly conductive organic sublayer is deposited thereon. Then the OLED stack is made and the second electrode 3 is applied. The bus electrodes 4 are applied to the second electrode 3 so that they alternate with respect to bus electrodes 51. This has the advantage that different conducting paths 1a and 1b, in the case of a non-ideal conducting layer, together always add up to the same path lengths. This partially compensates lateral voltage drops over the nonideally conductive layer.

FIG. 8 shows a top view of the structures of the bus electrodes of the corresponding electrodes. Here, the individual conducting segments 57 are arranged essentially parallel to each other. In the left-hand drawing, the two structures of the bus electrodes 5 and 4 are arranged on top of each other. In the right-hand drawing, there is an alternative realization of the respective structures of the bus electrodes 4 and 5, so that in the top view that is shown, a conducting segment 57 of the structure of the bus electrodes 5 is alternatingly adjacent to a conductive segment 47 of the structure of the bus electrodes 4.

FIG. 7 shows other design possibilities for bus structures. Here, the bus structures can be made in the form of squares or rectangles, thus with conductive segments running perpendicular to each other (bus structure 54). The right-hand drawing shows an alternative bus structure 55 in the form of a honeycomb.

Depending on the application, it can be useful to make organic light-emitting diodes that extract light only on one side. FIG. 4 shows such an embodiment. In this case, the second electrode 33 comprises a metal layer in the form of a planar electrode that has a reflecting surface for the light generated in organic layer 1. Correspondingly, the photons produced by charge carrier recombination are reflected from the mirrored surface of the second electrode 33 and decoupled through the first electrode 2 and the substrate 6, which can be a glass substrate. The first electrode 2 with the highly conductive layer can also be a metal or even a conductive metal oxide.

Figure 5:
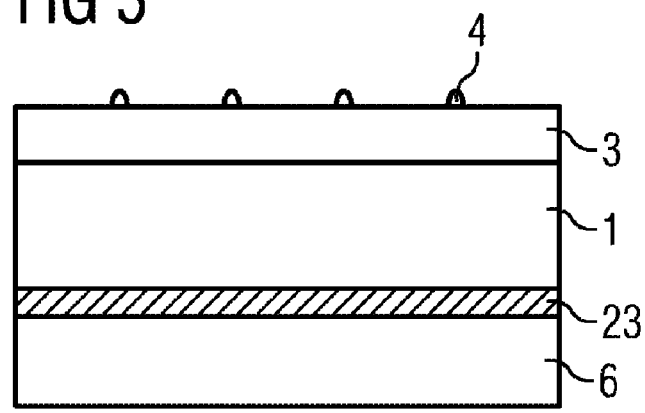
FIG. 5 shows a fifth embodiment example of the invention.

FIG. 5 shows a similar design, in which the first electrode 2 has been replaced by an inorganic layer 23. This inorganic layer 23, which is the anode, can be, for example, an indium-doped zinc oxide. Likewise, it is possible to use a pure metallic layer as a substitute for the first electrode 2. The light in this case is extracted through the second electrode 3. The embodiment shown in FIG. 5 thus corresponds to a so-called top emitter.

Figure 6:
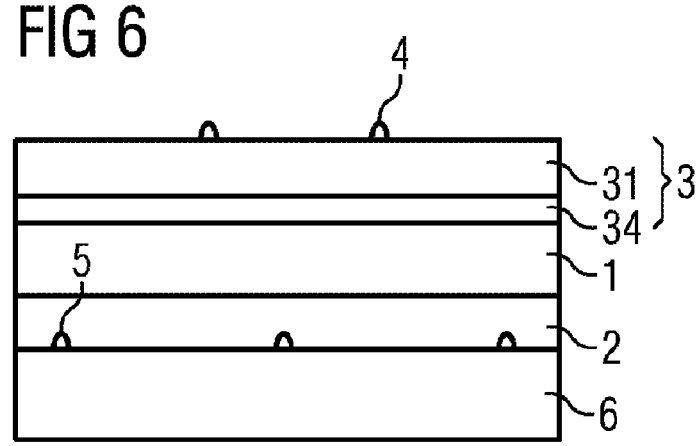
FIG. 6 shows a sixth embodiment example of the invention.

Finally, FIG. 6 shows another embodiment example, in which the second electrode 3 has a first highly conductive organic sublayer 31 and a second conductive sublayer 34. The highly conductive organic sublayer 31 can contain the same material as the first electrode 2. Since charge carriers of different conduction types are injected via the first and the second electrodes 2 and 3 into the OLED stack or the at least one organic layer 1, this can result in the need for additional matching to the OLED stack if the same materials are used for the highly conductive organic sublayer 31 and the first electrode 2. In the embodiment shown here, the highly conductive organic sublayer 31, or the first electrode 2, contains the material PEDOT:PSS. This material is a so-called hole conductor. Since hole electrons are injected as charge carriers in the second electrode 3, which can be a cathode, an additional matching to the upper layer of the OLED stack is necessary. This is provided by the second conductive layer 34, which is additionally n-doped here. The highly conductive organic system of the sublayer 31 can in this way be matched to the OLED stack.

Thus, good ohmic contact to materials is possible that actually do not allow suitable contact for the injection of the charge carriers from the standpoint of the energy level through the doped second conductive sublayer 34. Correspondingly, it is also conceivable to specify the second conductive sublayer 34 even between the first electrode 2 and the OLED stack or the at least one organic layer 1. Alternatively, an additional inorganic layer can be used instead of the organic second conductive sublayer 34. It then provides for a matching of the at least one organic layer 1 to the organic electrode, provided this is necessary, for example, for process compatibility.

Likewise, an additional inorganic sublayer can be used to improve charge carrier injection into the OLED stack. This is useful when the inorganic sublayer as such exhibits a clearly poorer conductivity than the highly conductive organic material and thus would be unsuitable as the only electrode. However, through the additional highly conductive organic sublayer 31, good lateral distribution of charge carriers can also be achieved here.

The embodiments with the electrodes of highly conductive organic layers that are shown here can be produced in various ways.

Solvent-based production methods such as spin-coating, spraying or printing may be used. For spraying and for printing, a mask or a screen can additionally be used to structure the relevant layers. In the case of spin-coating, structuring is achieved by local cross-linking of the layer and washing off the not cross-linked regions. Cross-linking, for example, with organic polymers, moreover offers the possibility of applying solvent-based layers in several layers without redissolving a prior layer as a new one is applied.

Another possibility is to produce organic materials by vapor deposition or OVPD processes. Especially conductive organic layers can also be realized in a coevaporation of doped materials.

Moreover, the use of additional bus electrode structures offers an easier possibility for repair of light sources produced with some flaws. The yield of manufactured light sources can be increased with the help of a repair.

During manufacture, a local short circuit, for example, due to conductive soil particles or other contaminants, may occur in the application of the individual organic layers. These local short circuits frequently lead to increased current flow within the electroluminescent organic semiconductor element and thus to thermal heating at this area. The organic layer can become damaged by thermal heating and the luminous efficacy will decrease. For a repair, the faulty site is now ascertained, for example, by visual inspection of the semiconductor element.

Then the bus elements in the vicinity of the faulty site are determined and selectively destroyed by cutting the conductive segments. In this way, the voltage drop in the affected organic layer, which now has to take place over a longer path, is increased. The local short circuit within the organic layer no longer gives rise to damage in the semiconductor element due to the additionally introduced resistance. Selective cutting of conductive elements has hardly any effect on the overall performance of the lighting element, provided the ratio of the active area of the semiconductor element to the excised area remains sufficiently large. The electrode structures shown in FIG. 7 are particularly suitable for this, since a local region can be excised from the network without affecting the large-area conductivity of the bus electrode structure.

The invention claimed is:

1. An electroluminescent organic semiconductor element comprising:
    a substrate;
    a first electrode arranged above the substrate;
    a second electrode wherein the first and/or the second electrode comprises a highly conductive organic sublayer, wherein the electrode comprising the highly conductive organic sublayer further comprises a second conductive sublayer, which has different conductivity than the highly conductive organic sublayer and wherein the highly conductive organic sublayer shows a first type of conduction and the second conductive sublayer shows a second type of conduction that is different from the first type of conduction; and
    at least one organic layer arranged between the first electrode and the second electrode, the at least one organic layer comprising a layer that generates light by a recombination of charge carriers.

2. The semiconductor element of claim 1, wherein the first electrode and/or the second electrode are designed for wide-area delivery of charge carriers of different types to the at least one organic layer.

3. The semiconductor element of claim 1, wherein the highly conductive organic sublayer comprises at least one material selected from the group consisting of:
    polymers;
    small molecules;
    doped polymers;
    doped small molecules;
    PEDOT:PSS;
    PANI:PSS;
    ZnPc/F4-TCNQ;
    MeO-TPD/F4-TCNQ; and
    BEDT-TTF.

4. The semiconductor element of claim 1, wherein the highly conductive organic sublayer comprises a polymer doped with a metal or an organic salt or an inorganic salt, or a doped small molecule.

5. The semiconductor element of claim 1, further comprising a second conductive sublayer, which comprises a metallization layer and which is applied between the highly conductive organic sublayer and the substrate or on the second electrode.

6. The semiconductor element of claim 1, wherein the substrate and the first electrode are at least partially transparent for one wavelength of the light generated by the at least one organic layer.

7. The semiconductor element of claim 1, wherein the second electrode is at least partially transparent for one wavelength of the light generated by the at least one organic layer.

8. The semiconductor element of claim 1, wherein the highly conductive organic sublayer has a conductivity greater than 0.1 S/cm.

9. The semiconductor element of claim 1, wherein the second conductive sublayer comprises a doped organic material.

10. The semiconductor element of claim 1, wherein the second conductive sublayer comprises an inorganic material.

11. The semiconductor element of claim 1, wherein the second conductive sublayer is arranged between the highly conductive organic sublayer and the at least one organic layer.

12. The semiconductor element of claim 1, wherein at least one electrode comprises a highly conductive bus electrode, which is applied to the highly conductive organic sublayer.

13. The semiconductor element of claim 12, wherein the bus electrode is a metallic bus electrode having a plurality of conductive segments extending essentially parallel over the highly conductive organic sublayer.

14. The semiconductor element of claim 13, wherein the essentially parallel conductive segments of the at least one electrode are alternatingly arranged with respect to essentially parallel conductive segments of another electrode.

15. The semiconductor element of claim 12, wherein the bus electrode is a metallic bus electrode having a plurality of conductive segments that are electrically connected together so as to form a honeycomb structure.

16. The semiconductor element of claim 1, wherein the first and second electrodes each comprise a highly conductive organic sublayer on each of which a metallic bus electrode is applied.

17. The semiconductor element of claim 1, wherein the first and second electrodes have essentially a same sheet resistance.

18. A method for repair of the semiconductor element of claim 1, wherein at least one electrode comprises a metallic bus electrode to improve a lateral voltage drop, the method comprising:
    determining a faulty site in the at least one organic layer of the semiconductor element;
    identifying conductive segments of the bus electrode in an area of the determined faulty site; and
    selectively destroying the identified conductive segments to increase the lateral voltage drop in a region of the faulty site in the at least one organic layer.

19. The method of claim 18, wherein determining the faulty site comprises visually inspecting the semiconductor element.

20. The method of claim 18, wherein selectively destroying comprises cutting the identified conductive segments using a laser beam.

* * * * *